US010899620B2

(12) United States Patent
Sato

(10) Patent No.: US 10,899,620 B2
(45) Date of Patent: Jan. 26, 2021

(54) CARBON CONDUCTIVE STRUCTURE AND METHOD OF MANUFACTURING THE SAME

(71) Applicant: FUJITSU LIMITED, Kawasaki (JP)

(72) Inventor: Motonobu Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 252 days.

(21) Appl. No.: 14/661,570

(22) Filed: Mar. 18, 2015

(65) Prior Publication Data
US 2016/0272500 A1 Sep. 22, 2016

(51) Int. Cl.
C01B 32/182 (2017.01)
H01L 23/532 (2006.01)
H01L 23/48 (2006.01)
H01L 23/482 (2006.01)
H01L 23/522 (2006.01)
H05K 1/11 (2006.01)
H05K 1/09 (2006.01)
H05K 3/40 (2006.01)
B32B 37/14 (2006.01)

(52) U.S. Cl.
CPC .......... *C01B 32/182* (2017.08); *B32B 37/144* (2013.01); *H01L 23/481* (2013.01); *H01L 23/482* (2013.01); *H01L 23/5226* (2013.01); *H01L 23/53276* (2013.01); *H05K 1/09* (2013.01); *H05K 1/115* (2013.01); *H05K 3/4038* (2013.01); *B32B 2307/202* (2013.01); *B32B 2307/206* (2013.01); *B32B 2313/04* (2013.01); *B32B 2457/00* (2013.01)

(58) Field of Classification Search
CPC .......... H01L 23/53276; H01L 23/5226; H01L 21/76807; H01L 2221/1094
See application file for complete search history.

(56) References Cited

U.S. PATENT DOCUMENTS

| 2011/0006425 | A1 | 1/2011 | Wada | |
| 2011/0059599 | A1* | 3/2011 | Ward | B82Y 30/00 438/507 |
| 2011/0101528 | A1* | 5/2011 | Akimoto | H01L 21/76802 257/751 |
| 2011/0115094 | A1* | 5/2011 | Darnon | H01L 21/02126 257/774 |
| 2012/0080662 | A1 | 4/2012 | Saito et al. | |

(Continued)

FOREIGN PATENT DOCUMENTS

JP 2009-70911 A1 4/2009
JP 2011-23420 A1 2/2011
(Continued)

OTHER PUBLICATIONS

Japanese Patent Application No. 2013-195531: Notification of Reasons for Refusal dated Mar. 21, 2017.

*Primary Examiner* — Jesse Y Miyoshi
(74) *Attorney, Agent, or Firm* — Kratz, Quintos & Hanson, LLP

(57) ABSTRACT

A carbon conductive structure includes: first graphenes of a graphene plug which are stacked in a plurality of layers along a vertical direction; and second graphenes of a graphene wiring line which are stacked in a plurality of layers along the vertical direction, wherein edge portions of the first graphenes and edge portions of the second graphenes are electrically connected to each other.

1 Claim, 14 Drawing Sheets

(56) References Cited

U.S. PATENT DOCUMENTS

2014/0291819 A1* 10/2014 Barth ................ H01L 23/53276
257/659
2015/0270225 A1* 9/2015 Yang ................ H01L 23/53276
257/750

FOREIGN PATENT DOCUMENTS

| JP | 2011-187722 A | 9/2011 |
| JP | 2012-080005 A | 4/2012 |
| JP | 2013-058669 A | 3/2013 |
| JP | 2013-172083 A | 9/2013 |

\* cited by examiner

CARBON CONDUCTIVE STRUCTURE AND METHOD OF MANUFACTURING THE SAME

FIELD

The embodiments discussed herein are directed to a carbon conductive structure and a method of manufacturing the same.

BACKGROUND

In semiconductor devices, metal materials such as W, Cu, and Al are mainly used as materials of wiring lines, plugs, vias, through vias (TSV), and so on. As materials replacing these, carbon-based materials such as graphene and carbon nanotube (CNT) can be named as materials having low resistivity, high current density resistance, and high thermal conductivity.

As arts which applies the carbon-based material to wiring lines and so on, an art to form graphite in part of wiring trenches (Patent Document 1), an art to connect graphenes by using a contact block of metal or the like (Patent Document 2), and so on have been invented.

Patent Document 1: Japanese Laid-open Patent Publication No. 2011-23420
Patent Document 2: Japanese Laid-open Patent Publication No. 2009-70911

The art using the contact block has a problem that full use cannot be made of properties of carbon thermally and electrically.

It can be thought to directly connect carbon-based materials of a via and a wiring line by applying the art to form graphite in part of the wiring trenches. This case, however, has a problem that, when, for example, CNT is used as the vias and sheet graphene is used as the wiring lines, connecting an end portion of the CNT and a surface of the graphene parallel to a substrate surface greatly increases resistance of a connection interface. It is very difficult to connect the both without causing the resistance increase.

SUMMARY

A carbon conductive structure according to an aspect of the present invention includes: first graphenes stacked in a plurality of layers; and second graphenes stacked in a plurality of layers, wherein edge portions of the first graphenes and edge portions of the second graphenes are electrically connected to each other.

A carbon conductive structure according to another aspect of the present invention includes: a plurality of line-shaped carbon nano materials arranged in a bundle; and graphenes stacked in a plurality of layers, wherein end portions of the carbon nano materials and edge portions of the graphenes are electrically connected to each other.

A method of manufacturing a carbon conductive structure according to still another aspect of the present invention includes: stacking first graphenes in a plurality of layers; and stacking second graphenes in a plurality of layers, wherein edge portions of the first graphenes and edge portions of the second graphenes are electrically connected to each other.

A method of manufacturing a carbon conductive structure according to yet another aspect of the present invention includes: forming a plurality of line-shaped carbon nano materials arranged in a bundle; and stacking graphenes in a plurality of layers, wherein end portions of the carbon nano materials and edge portions of the graphenes are electrically connected to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, as an electronic device to which the carbon conductive structure of the present invention is applied, a MOS transistor of a semiconductor device is described as an example. The carbon conductive structure of the present invention is applicable to other semiconductor devices such as a semiconductor memory, TSV for conduction or heat release, electrodes of solar cells and fuel cells, cold cathode electron sources, and so on.

First Embodiment

FIG. 1A to FIG. 4C are schematic cross-sectional views illustrating a method of manufacturing a semiconductor device according to a first embodiment in order of processes. In this embodiment, a method like single damascene is employed for forming wiring structures which become carbon conductive structures.

Figure 1A:
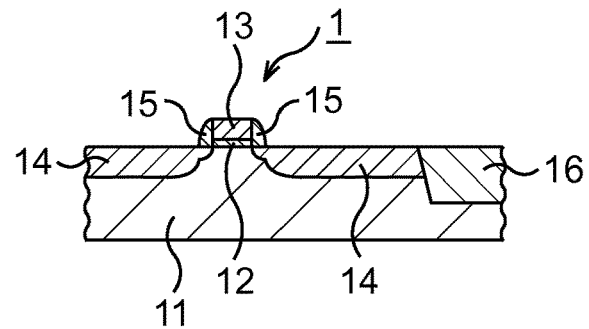
FIG. 1A to FIG. 1C are schematic cross-sectional views illustrating a method of manufacturing a semiconductor device according to a first embodiment in order of processes.

First, as illustrated in FIG. 1A, a MOS transistor 1 is formed on a semiconductor substrate 11.

The MOS transistor 1 includes a gate electrode 13 formed on the semiconductor substrate 11 via a gate insulating film 12 and a source/drain regions 14 on both sides thereof.

On the semiconductor substrate 11 being, for example, a Si substrate, the gate electrode 13 is formed via the gate insulating film 12 in an active region demarcated by element isolation structures 16 (for example, STI (Shallow Trench Isolation)), by using polycrystalline silicon or the like as its material. On both sides of the gate electrode 13, sidewalls 15 of an insulating material are formed by, for example, an etch-back method.

The source/drain regions 14 are formed of P-type impurities (boron or the like) or N-type impurities (phosphorus, arsenic, or the like) introduced into the active regions on the both sides of the gate electrode 13.

Figure 1B:
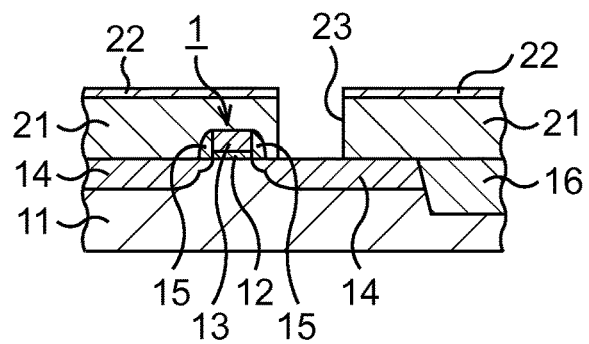

Subsequently, as illustrated in FIG. 1B, a catalytic metal film 21 and an inactivation film 22 which have an opening 23 at a plug formation position are formed. Note that, in the drawings in FIG. 1B to FIG. 4B, the illustration of part of the MOS transistor 1 is omitted.

In more detail, first, the gate insulating film 12, the gate electrode 13, and the sidewalls 15 are covered by a protective film of, for example, SiN or the like.

Next, Co, Ni, Fe, Pt, or the like being metal which serves as a catalyst in graphene formation, for example, Co is deposited to a thickness of, for example, about 300 nm on the semiconductor substrate 11 by, for example, a sputtering method or the like. Consequently, the catalytic metal film 21 is formed on the semiconductor substrate 11.

Next, Ti, TiN, $SiO_2$, or the like being a material which obstructs the graphene formation, here, $SiO_2$ is deposited to a thickness of, for example, about 30 nm on the catalytic metal film 21 by a sputtering method or the like. Consequently, the inactivation film 22 is formed on the catalytic metal film 21.

Next, by lithography and dry etching, the plug formation position of the catalytic metal film 21 and the inactivation film 22 is opened. Consequently, the opening 23 is formed in the catalytic metal film 21 and the inactivation film 22.

Here, when the opening 23 is formed so that its horizontal sectional shape becomes, for example, a rectangular shape, it is desirable that the opening 23 exposes the catalytic metal film 21 from its pair of sidewalls appearing in FIG. 1B and on its other pair of sidewalls, the inactivation film is formed.

Figure 1C:
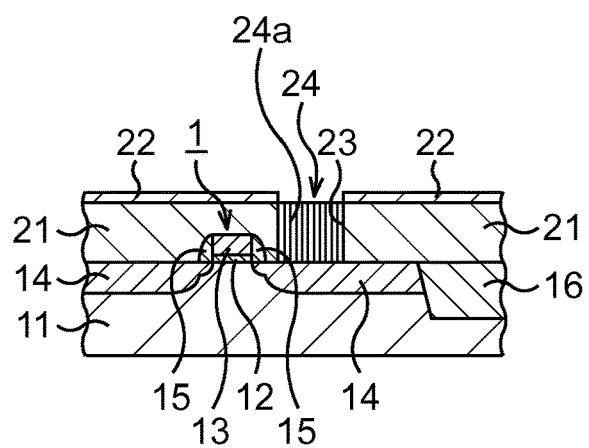

Subsequently, as illustrated in FIG. 1C, a multilayer graphene 24 is formed.

In more detail, carbon is deposited in the opening 23 by a CVD method. As a CVD condition, diluent gas such as methane or acetylene is used, and a processing temperature is set to about 600° C. to about 1200° C., here about 600° C. At this time, the carbon is not deposited on a surface of the catalytic metal film 21 because the inactivation film 22 is formed thereon, and is deposited only on the pair of side surfaces in the opening 23 where the inactivation film 22 does not exist. In this case, sheet-shaped graphenes 24a are stacked in a plurality of layers along (in parallel to) the pair of side surfaces, so that the multilayer graphene 24 filling the inside of the opening 23 is formed. That is, the multilayer graphene 24 is formed in a state where the graphenes 24a grow in a vertical direction along contact surfaces (the pair of side surfaces) of the catalytic metal film 21 and the graphenes 24a are stacked in the plural layers to fill the inside of the opening 23.

Figure 2A:
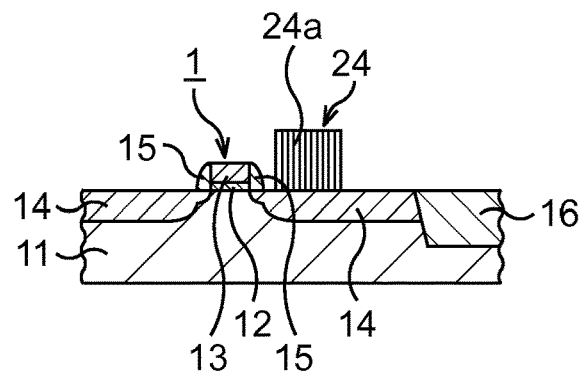
FIG. 2A to FIG. 2C, continuing from FIG. 1C, are schematic cross-sectional views illustrating the method of manufacturing the semiconductor device according to the first embodiment in order of processes.

Subsequently, as illustrated in FIG. 2A, the catalytic metal film 21 and the inactivation film 22 are removed.

In more detail, the catalytic metal film 21 and the inactivation film 22 are subjected to acid treatment by using, for example, a $FeCl_3$ aqueous solution, a HCl dilute aqueous solution, or the like. Alternatively, they are subjected to dry etching treatment by using RIE or the like. These treatments may be combined. Consequently, the catalytic metal film 21 and the inactivation film 22 are removed.

Figure 2B:
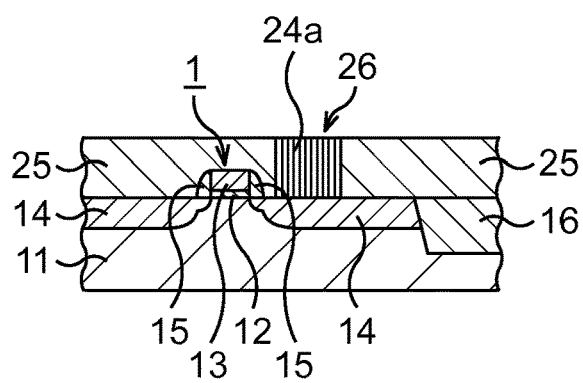

Subsequently, as illustrated in FIG. 2B, an interlayer insulating film 25 covering side surfaces of the multilayer graphene 24 is formed.

In more detail, first, an insulating material, for example, a silicon oxide is deposited on the semiconductor substrate 11 by a CVD method, a SOG method, or the like so as to cover the multilayer graphene 24.

Next, the silicon oxide is polished by, for example, CMP (Chemical-Mechanical Polishing) by using an upper surface of the multilayer graphene 24 as a polishing stopper, whereby the silicon oxide is planarized. By this planarization, the interlayer insulating film 25 covering the side surfaces of the multilayer graphene 24 is formed. The multilayer graphene 24 becomes a graphene plug 26 buried in the interlayer insulating film 25. The graphene plug 26 is formed so that main surfaces of the graphenes 24a stacked along the vertical direction and a main surface (front surface) of the interlayer insulating film 25 intersect with each other, in this embodiment, are substantially perpendicular to each other.

In the state in FIG. 2B, molecules of a different kind may be intercalated in the graphene plug 26. The intercalated molecules of the different kind are not particularly limited, but at least one kind selected from $FeCl_3$, K, Rb, Cs, Li, $HNO_3$, $SbCl_5$, $SbF_5$, $Br_2$, $AiCl_3$, $NiCl_2$, $AsF_5$, and $AuCl_3$ is desirably used. Here, $FeCl_3$ is used, for instance. This intercalation makes it possible to greatly lower electric resistance and thermal resistance of the graphene plug 26.

Adhesiveness of the graphene plug 26 is kept in the interlayer insulating film 25. Therefore, the graphene plug 26 is formed in the interlayer insulating film 25 without barrier metal or the like being interposed therebetween. By adopting this structure, the graphene plug 26 is formed only of the multilayer graphene 24 (and the intercalant) without having the other structure (barrier metal or the like) which causes an increase of the electric resistance and the thermal resistance, enabling further reduction of the electric resistance and further reduction of the thermal resistance of the graphene plug 26.

Figure 2C:
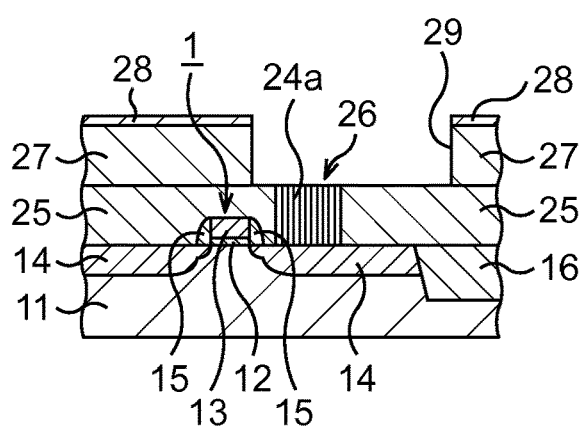

Subsequently, as illustrated in FIG. 2C, a catalytic metal film 27 and an inactivation film 28 having an opening 29 at a wiring line formation position are formed.

In more detail, first, Co, Ni, Fe, Pt, or the like being metal which serves as a catalyst in graphene formation, for example, Co is deposited to a thickness of, for example, about 300 nm on the interlayer insulating film 25 by a sputtering method or the like. Consequently, the catalytic metal film 27 is formed on the interlayer insulating film 25.

Next, Ti, TiN, SiO$_2$, or the like being a material which obstructs the graphene formation, here, SiO$_2$ is deposited to a thickness of, for example, about 30 nm on the catalytic metal film 27 by a sputtering method or the like. Consequently, the inactivation film 28 is formed on the catalytic metal film 27.

Next, by lithography and dry etching, the wiring line formation position of the catalytic metal film 27 and the inactivation film 28 is opened. Consequently, the opening 29 is formed in the catalytic metal film 27 and the inactivation film 28.

Here, when the opening 29 is formed in, for example, a rectangular shape, it is desirable that the opening 29 exposes the catalytic metal film 27 from its pair of sidewalls appearing in FIG. 2C and on its other pair of sidewalls, the inactivation film 28 is formed.

Figure 3A:
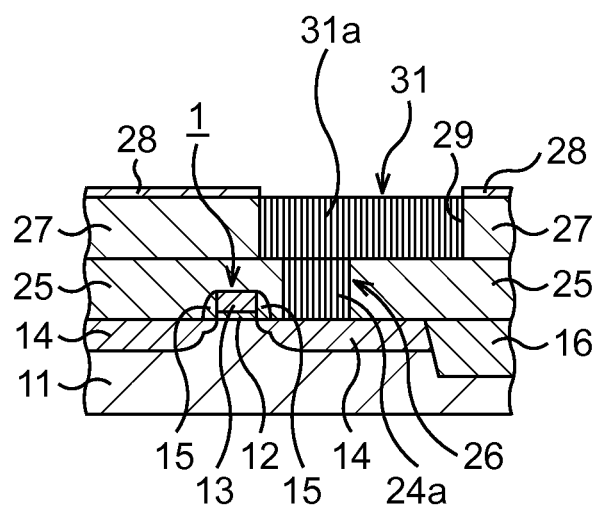
FIG. 3A and FIG. 3B, continuing from FIG. 2C, are schematic cross-sectional views illustrating the method of manufacturing the semiconductor device according to the first embodiment in order of processes.

Subsequently, as illustrated in FIG. 3A, a multilayer graphene 31 is formed.

In more detail, carbon is deposited in the opening 29 by a CVD method. As a CVD condition, diluent gas such as methane or acetylene is used, and a processing temperature is set to about 600° C. to about 1200° C., here about 600° C. At this time, the carbon is not deposited on a surface of the catalytic metal film 27 because the inactivation film 28 is formed thereon, and is deposited only on the pair of side surfaces in the opening 29 where the inactivation film 28 does not exist. In this case, sheet-shaped graphenes 31a are stacked in a plurality of layers along (in parallel to) the pair of side surfaces, so that the multilayer graphene 31 filling the inside of the opening 29 is formed. That is, the multilayer graphene 31 is formed in a state where the graphenes 31a grow in the vertical direction along contact surfaces (the pair of side surfaces) of the catalytic metal film 27 and the graphenes 31a are stacked in the plural layers to fill the inside of the opening 29.

Figure 3B:
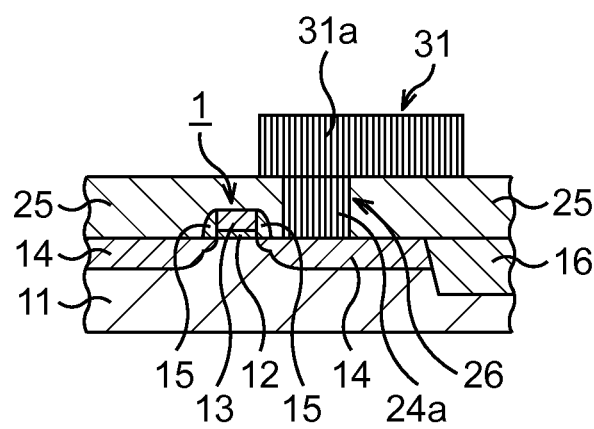

Subsequently, as illustrated in FIG. 3B, the catalytic metal film 27 and the inactivation film 28 are removed.

In more detail, the catalytic metal film 27 and the inactivation film 28 are subjected to acid treatment by using, for example, a FeCl$_3$ aqueous solution, a HCl dilute aqueous solution, or the like. Alternatively, they are subjected to dry etching treatment by using RIE or the like. These treatments may be combined. Consequently, the catalytic metal film 27 and the inactivation film 28 are removed.

Figure 4A:
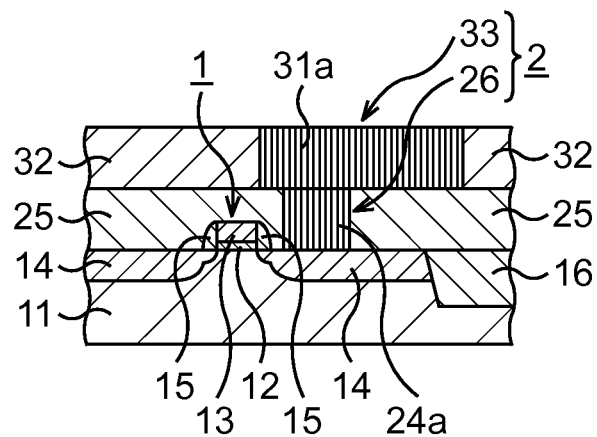
FIG. 4A and FIG. 4B, continuing from FIG. 3B, are schematic cross-sectional views illustrating the method of manufacturing the semiconductor device according to the first embodiment in order of processes.

Subsequently, as illustrated in FIG. 4A, an interlayer insulating film 32 covering side surfaces of the multilayer graphene 31 is formed.

In more detail, first, an insulating material, for example, a silicon oxide is deposited on the interlayer insulating film 25 by a CVD method, a SOG method, or the like so as to cover the multilayer graphene 31.

Next, the silicon oxide is polished by, for example, CMP by using an upper surface of the multilayer graphene 31 as a polishing stopper, whereby the silicon oxide is planarized. By this planarization, the interlayer insulating film 32 covering the side surfaces of the multilayer graphene 31 is formed. The multilayer graphene 31 becomes a graphene wiring line 33 buried in the interlayer insulating film 32. The graphene wiring line 33 is formed so that main surfaces of the graphenes 31a stacked along the vertical direction and a main surface (front surface) of the interlayer insulating film 32 intersect with each other, in this embodiment, are substantially perpendicular to each other.

In the state in FIG. 4A, molecules of a different kind may be intercalated in the graphene wiring line 33. The intercalated molecules of the different kind are not particularly limited, but at least one kind selected from FeCl$_3$, K, Rb, Cs, Li, HNO$_3$, SbCl$_5$, SbF$_5$, Br$_2$, AlCl$_3$, NiCl$_2$, AsF$_5$, and AuCl$_3$ is desirably used. Here, FeCl$_3$ is used, for instance. This intercalation makes it possible to greatly lower electric resistance and thermal resistance of the graphene wiring line 33.

Adhesiveness of the graphene wiring line 33 is kept in the interlayer insulating film 32. Therefore, the graphene wiring line 33 is formed in the interlayer insulating film 32 without barrier metal or the like being interposed therebetween. By adopting this structure, the graphene wiring line 33 is formed only of the multilayer graphene 31 (and the intercalant) without having the other structure (barrier metal) which causes an increase of the electric resistance and the thermal resistance, enabling further reduction of the electric resistance and further reduction of the thermal resistance of the graphene wiring line 33.

By the graphene plug 26 and the graphene wiring line 33 connected thereto, a wiring structure 2 is formed.

In the wiring structure 2, edge portions of the graphenes 24a of the graphene plug 26 and edge portions of the graphenes 31a of the graphene wiring line 33 are in contact with each other to be electrically connected. Thus bonding the graphenes 24a and the graphenes 31a at their edge portions suppresses an increase of electric resistance and thermal resistance of the wiring structure 2 ascribable to this bonding as much as possible and realizes a highly reliable wiring structure.

In the wiring structure 2, at connection portions between the graphenes 24a and the graphenes 31a, an extension direction of the edge portions of the graphenes 24a and an extension direction of the edge portions of the graphenes 31a are substantially parallel to each other. Here, the graphene wiring line 33 may be formed by stacking the graphenes 31a along the vertical direction so that the extension direction of the edge portions of the graphenes 24a and the extension direction of the edge portions of the graphenes 31a intersect with each other, for example, are substantially perpendicular to each other.

Figure 4B:
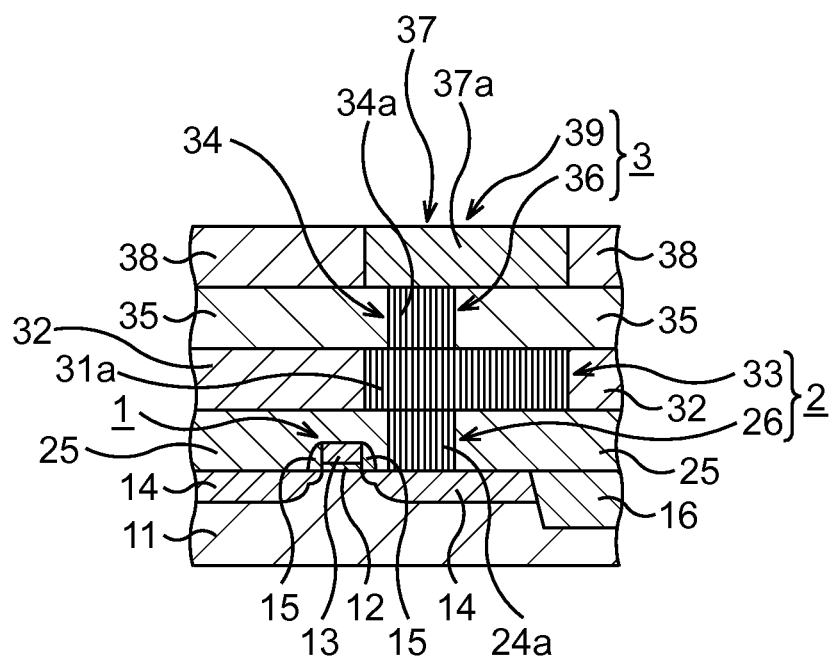

Subsequently, as illustrated in FIG. 4B, on the wiring structure 2, a wiring structure 3 connected thereto is formed.

The wiring structure 3 is formed in substantially the same manner as the wiring structure 2.

Specifically, on the interlayer insulating film 32, a multilayer graphene 34 in which a plurality of layers of sheet-shaped graphenes 34a are stacked along the vertical direction is formed, and an interlayer insulating film 35 covering side surfaces of the multilayer graphene 34 is formed. Consequently, a graphene via 36 formed of the multilayer graphene 34 being buried in the interlayer insulating film 35 is formed. Molecules of a different kind may be intercalated in the graphene via 36.

On the interlayer insulating film 35, a multilayer graphene 37 in which a plurality of layers of sheet-shaped graphenes 37a are stacked along the vertical direction is formed, and an interlayer insulating film 38 covering side surfaces of the multilayer graphene 37 is formed. Consequently, a graphene wiring line 39 formed of the multilayer graphene 37 being buried in the interlayer insulating film 38 is formed. Molecules of a different kind may be intercalated in the graphene wiring line 39.

Figure 5:
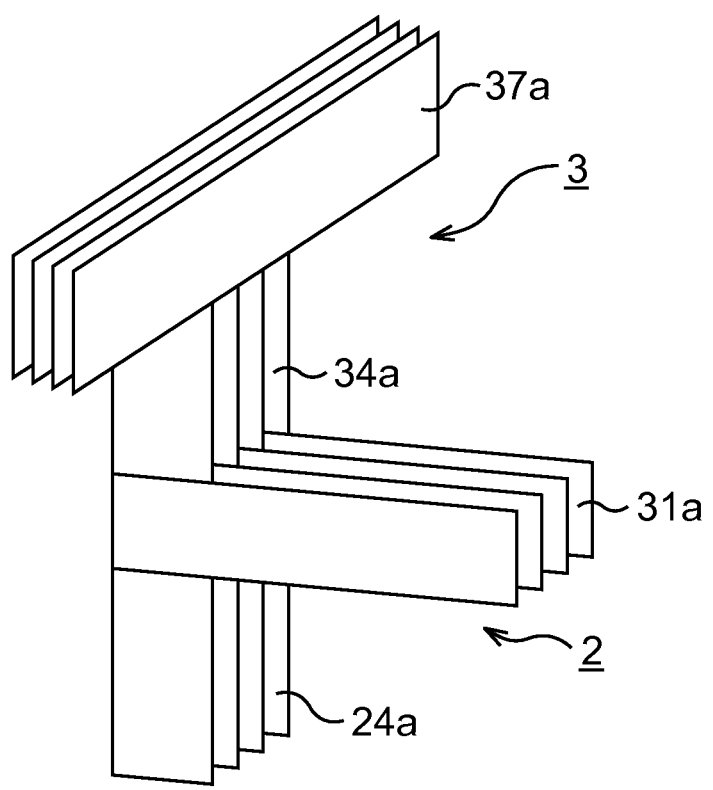
FIG. 5 is a schematic perspective view schematically illustrating only a formation state of a multilayer wiring structure in the first embodiment.

By the graphene via 36 and the graphene wiring line 39 connected thereto, the wiring structure 3 is formed. FIG. 5 is a schematic perspective view schematically illustrating only the multilayer graphenes 24, 31, 34, 37 forming the wiring structures 2, 3, regarding a formation state of the wiring structures 2, 3.

In the wiring structure 3, edge portions of the graphenes 34a of the graphene via 36 and edge portions of the graphenes 37a of the graphene wiring line 39 are in contact with each other to be electrically connected. Thus bonding the graphenes 34a and the graphenes 37a at their edge portions suppresses an increase of electric resistance and thermal resistance of the wiring structure 3 ascribable to this bonding as much as possible and realizes a highly reliable wiring structure.

In the wiring structure 3, at connection portions between the graphenes 34a and the graphenes 37a, an extension direction of the edge portions of the graphenes 34a and an extension direction of the edge portions of the graphenes 37a intersect with each other, for example, are substantially perpendicular to each other. Here, the graphene wiring line 39 may be formed by stacking the graphenes 37a along the vertical direction so that the extension direction of the edge portions of the graphenes 34a and the extension direction of the edge portions of the graphenes 37a become substantially parallel to each other.

The wiring structure 2 and the wiring structure 3 are electrically connected to each other by the graphene wiring line 33 and the graphene via 36 being bonded to each other. In this case, the edge portions of the graphenes 31a of the graphene wiring line 33 and the edge portions of the graphenes 34a of the graphene via 36 are in contact with each other to be electrically connected. Thus bonding the graphenes 31a and the graphenes 34a at their edge portions suppresses an increase of the electric resistance and the thermal resistance of the wiring structures 2, 3 ascribable to this bonding as much as possible.

Thereafter, similarly to the wiring structure 3, the necessary number of wiring structures connected to the wiring structure 3 are formed sequentially on the wiring structure 3, whereby a multilayer wiring structure is formed. Consequently, the semiconductor device is formed.

Incidentally, in this embodiment, the case where the multilayer wiring structure is formed directly on the MOS transistor is described as an example, but it is also possible to form this multilayer wiring structure in advance and connect it by transfer or the like to a substrate on which the MOS transistor is formed.

As described hitherto, according to this embodiment, it is possible to easily and surely obtain simple wiring capable of sufficiently exhibiting excellent low electric resistance and low thermal resistance of the sheet-shaped graphenes, and a highly reliable multilayer wiring structure is realized.

Incidentally, in the above manufacturing method, the case where the multilayer graphenes are formed by the CVD method is described as an example, but this embodiment is not limited to this. For example, the multilayer graphenes may be formed by a sputtering method or a vapor deposition method instead of the CVD method. Hereinafter, a case where the sputtering method is used will be described.

FIG. 6A to FIG. 6D are schematic cross-sectional views illustrating a case where the multilayer graphene of the graphene plug 26 is formed by the sputtering method in the first embodiment.

Figure 6A:
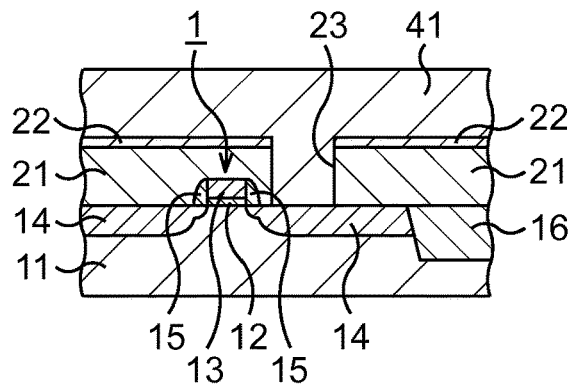
FIG. 6A to FIG. 6D are schematic cross-sectional views illustrating a case where a multilayer graphene of a graphene plug is formed by a sputtering method in the first embodiment.

In this case, after the various processes in FIG. 1A to FIG. 1B, carbon 41 is deposited as illustrated in FIG. 6A.

In more detail, the carbon 41 is deposited to a thickness of, for example, about 300 nm on the whole surface including the inside of the opening 23, by a directive sputtering method. Incidentally, the vapor deposition method may be used instead of the sputtering method.

Figure 6B:
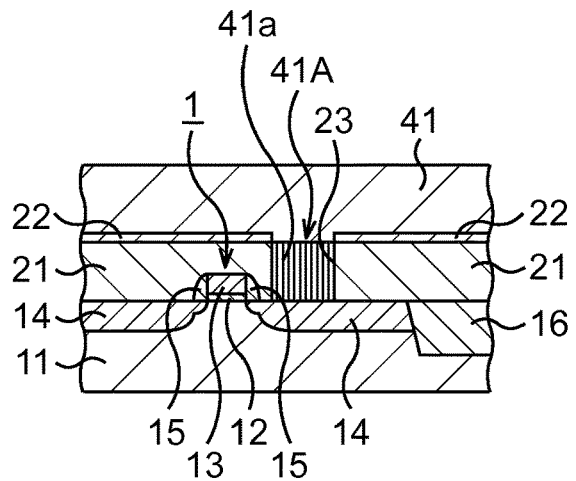

Subsequently, as illustrated in FIG. 6B, a multilayer graphene 41A is formed.

In more detail, a processing temperature is set to 600° C. or higher, here, about 1200° C., and the carbon 41 is heat-treated, with the processing time being set to about one second to about one hour depending on the processing temperature, here, about ten seconds. Consequently, portions, of the carbon 41, that are in contact with the pair of side surfaces in the opening 23 where the inactivation film does not exist turn into a stacked structure of sheet-shaped graphenes 41a, and the multilayer graphene 41A filling the inside of the opening 23 is formed. That is, the multilayer graphene 41A is formed in a state where the graphenes 41a grow in the vertical direction along contact surfaces (pair of side surfaces) of the catalytic metal film 21 and the plural layers of graphenes 41a fill the inside of the opening 23.

Figure 6C:
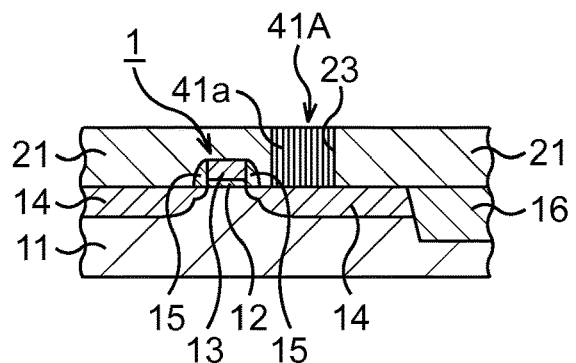

Subsequently, as illustrated in FIG. 6C, the carbon 41 and the inactivation film 22 are removed.

In more detail, the carbon 41 not having undergone a reaction on the multilayer graphene 41A and the inactivation film 22 are polished by, for example, CMP, with the surface of the catalytic metal film 21 used as a polishing stopper. As a result of this polishing, the multilayer graphene 41A remains in the connection hole 23.

Figure 6D:
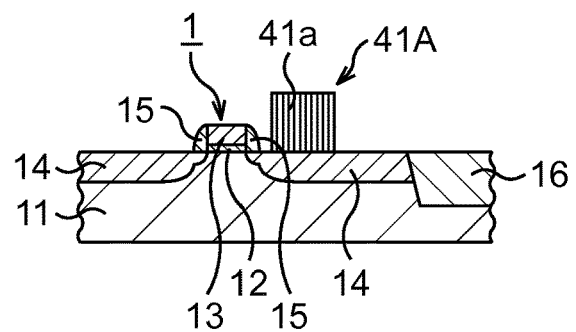

Subsequently, as illustrated in FIG. 6D, the catalytic metal film 21 is removed.

In more detail, the catalytic metal film 21 is wet-etched by using, for example, a $FeCl_3$ aqueous solution or a HCl dilute aqueous solution. Consequently, the catalytic metal film 21 is removed. Thereafter, the various processes from FIG. 2B on are performed.

Incidentally, the multilayer graphenes of the graphene wiring line 33, the wiring structure 3, and the wiring structures thereon may also be formed by the sputtering method or the vapor deposition method similarly to the above.

Modification Examples

Hereinafter, various modification examples of the first embodiment will be described.

In the first embodiment, it is described that the graphene plug 26 and the graphene wiring line 33 which form the wiring structure 2 and the graphene via 36 and the graphene wiring line 39 which form the wiring structure 3 are each formed of the multilayer graphene by the method like the single damascene. In the following modification examples, cases where the graphene plug 26 of the wiring structure 2 and the graphene via 36 of the wiring structure 3 are formed of other materials will be described as examples.

Modification Example 1

In this example, a case where a plug and a via of wiring structures are formed of metal materials will be described as an example.

Figure 7:
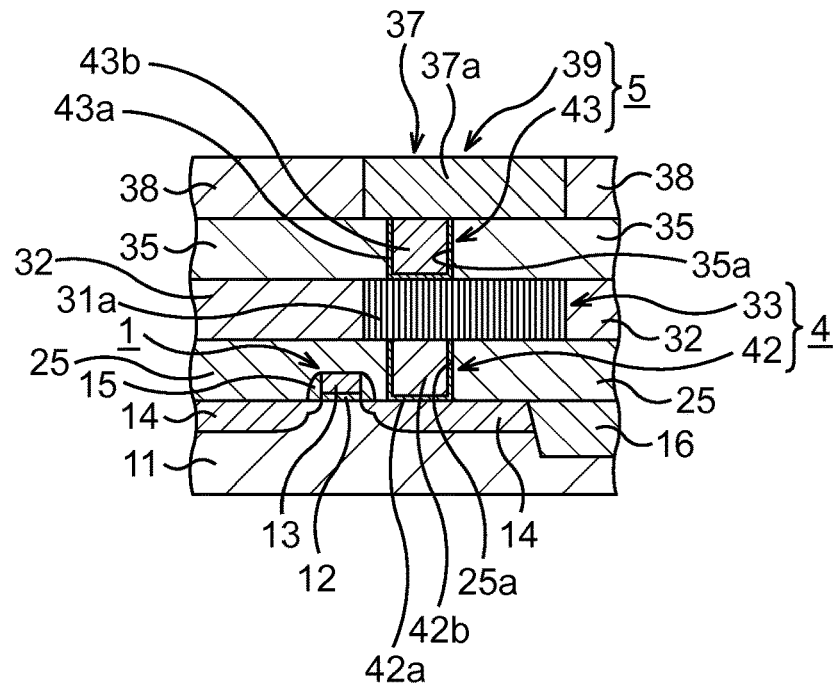
FIG. 7 is a schematic cross-sectional view illustrating the structure of a semiconductor device according to a modification example 1 of the first embodiment.

FIG. 7 is a schematic cross-sectional view illustrating the structure of a semiconductor device according to a modification example 1 of the first embodiment and corresponds to FIG. 4B of the first embodiment. Note that the same constituent members and so on as those of the first embodiment will be denoted by the same reference signs and detailed description thereof will be omitted. Further, the illustration of part of MOS transistor 1 is omitted.

In the semiconductor device according to this example, a wiring structure 4 including a W plug 42 and a graphene wiring line 33 and a wiring structure 5 including a Cu via 43 and a graphene wiring line 39 are formed.

To form the W plug 42, first, a connection hole 25a is formed in an interlayer insulating film 25, and in the connection hole 25a, tungsten (W) 42b is deposited via, for example, TiN being barrier metal 42a by, for example, a sputtering method, a CVD method, or the like. Then, the barrier metal 42a and the W 42b on the interlayer insulating film 25 are planarized by CMP or the like. Consequently, the W plug 42 formed of the W 42b filling the inside of the connection hole 25a of the interlayer insulating film 25 via the barrier metal 42a is formed.

To form the Cu via 43, first, a connection hole 35a is formed in an interlayer insulating film 35, and in the connection hole 35a, Cu 43b is grown via, for example, TaN being barrier metal 43a by, for example, a plating method or the like. Then, the barrier metal 43a and the Cu 43b on the interlayer insulating film 35 are planarized by CMP or the like. Consequently, the Cu via 43 formed of the Cu 43b filling the inside of the connection hole 35a of the interlayer insulating film 35 via the barrier metal 43a is formed.

According to this example, it is possible to easily and surely obtain simple wiring capable of sufficiently exhibiting excellent low electric resistance and low thermal resistance of sheet-shaped graphenes, and a highly reliable multilayer wiring structure is realized.

Modification Example 2

In this example, a case where a plug and a via of wiring structures are formed of carbon nanotubes (CNT) will be described as an example.

Figure 8:
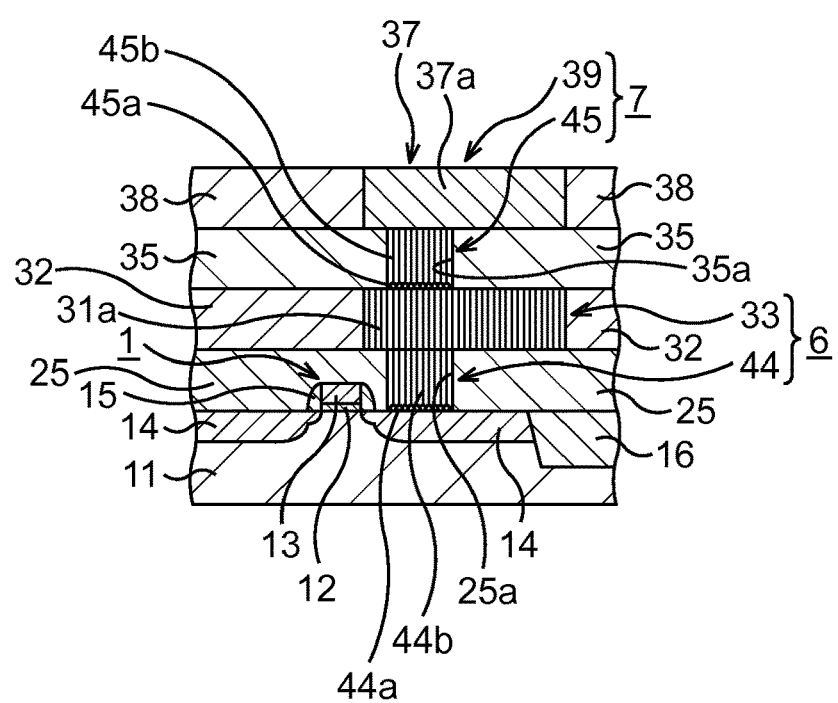
FIG. 8 is a schematic cross-sectional view illustrating the structure of a semiconductor device according to a modification example 2 of the first embodiment.

FIG. 8 is a schematic cross-sectional view illustrating the structure of a semiconductor device according to a modification example 2 of the first embodiment and corresponds to FIG. 4B of the first embodiment. Note that the same constituent members and so on as those of the first embodiment will be denoted by the same reference signs and detailed description thereof will be omitted. Further, the illustration of part of MOS transistor 1 is omitted.

Figure 9:
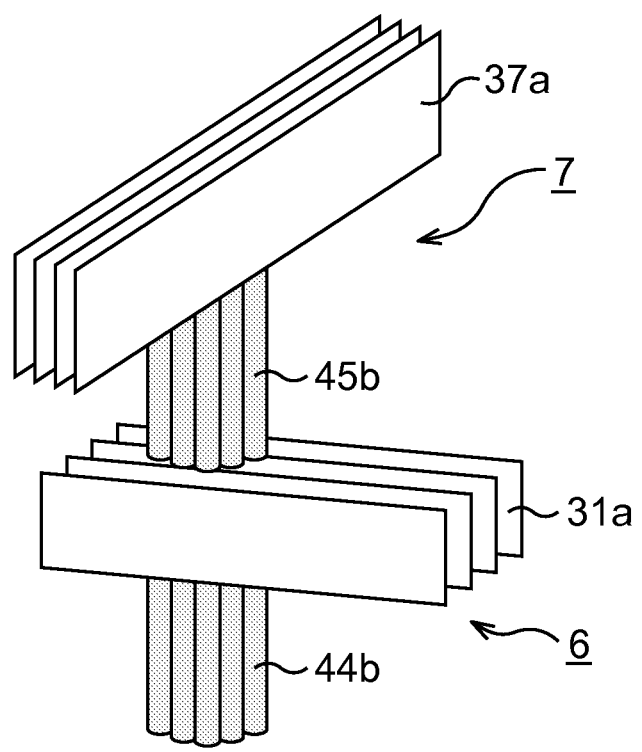
FIG. 9 is a schematic perspective view schematically illustrating only a formation state of a multilayer wiring structure in the modification example 2 of the first embodiment.

In the semiconductor device according to this example, a wiring structure 6 including a CNT plug 44 and a graphene wiring line 33 and a wiring structure 7 including a CNT via 45 and a graphene wiring line 39 are formed. FIG. 9 is a schematic perspective view schematically illustrating only CNTs and multilayer graphenes forming the wiring structures 6, 7, regarding a formation state of the wiring structures of this example.

To form the CNT plug 44, first, catalytic fine particles 44a of Co or the like as a catalytic material are deposited in a connection hole 25a of an interlayer insulating film 25 by a vacuum vapor deposition method or the like. Then, a CNT growth process is executed by, for example, thermal CVD, with an application direction of an electric field being set to a direction perpendicular to a substrate surface. Consequently, CNTs 44b are formed so as to rise from the catalytic fine particles 44a existing on a bottom surface of the connection hole 25a. Tip portions of the CNTs 44b are planarized by CMP or the like. Consequently, the CNT plug 44 in which the CNTs 44b rising from the catalytic fine particles 44a are formed in the connection hole 25a is formed.

To form the CNT via 45, first, catalytic fine particles 45a of Co or the like as a catalytic material are deposited in a connection hole 35a of an interlayer insulating film 35 by a vacuum vapor deposition method or the like. Then, a CNT growth process is executed by, for example, thermal CVD, with an application direction of an electric field being set to the direction perpendicular to the substrate surface. Consequently, CNTs 45b are formed so as to rise from the catalytic fine particles 45a existing on a bottom surface of the connection hole 35a. Tip portions of the CNTs 45b are planarized by CMP or the like. Consequently, the CNT via 45 in which the CNTs 45b rising from the catalytic fine particles 45a are formed in the connection hole 35a is formed.

Incidentally, instead of forming the CNTs 44b, 45b by growing as described above, the CNTs 44b, 45b may formed by implantation.

Specifically, by using a Si substrate or the like on whose surface an oxide film is formed, CNTs are formed by growing on the Si substrate, upper ends of the CNTs are planarized, a transfer support film is formed on the planarized portion, and the Si substrate is removed. The CNTs on the transfer support film are set to face the connection hole 25a (35a) of the interlayer insulating film 25 (35), and a volatile solvent is applied between the both facing each other. When the applied volatile solvent is dried, the interlayer insulating film 25 (35) comes into close contact with the CNTs. Tip portions of the CNTs are inserted into the connection hole 25a (35a) to be connected to the bottom surface of the connection hole 25a (35a). The transfer support film and unnecessary CNTs are removed by polishing or the like.

In this example, upper end portions of the CNTs 44b of the CNT plug 44 and edge portions of graphenes 31a of the graphene wiring line 33 are in contact with each other to be electrically connected. Thus bonding the CNTs 44b and the graphenes 31a at their edge portions suppresses an increase of electric resistance and thermal resistance of the wiring structure ascribable to this bonding as much as possible and realizes a highly reliable wiring structure.

In this example, the upper end portions of the CNTs 45b of the CNT via 45 and the edge portions of graphenes 37a of the graphene wiring line 39 are in contact with each other to be electrically connected. Thus bonding the CNTs 45b and the graphenes 37a at their edge portions suppresses an increase of electric resistance and thermal resistance of the wiring structure ascribable to this bonding as much as possible and realizes a highly reliable wiring structure.

Further, in the wiring structures 6, 7, the edge portions of the graphenes 31a of the graphene wiring line 33 and lower end portions of the CNTs 45b of the CNT via 45 are electrically connected via the catalytic fine particles 45a. Thus bonding the graphenes 31a and the CNTs 45b at their edge portions suppresses an increase of electric resistance and thermal resistance of the wiring structures ascribable to this bonding as much as possible.

According to this example, it is possible to easily and surely obtain simple wiring capable of sufficiently exhibiting excellent low electric resistance and low thermal resistance of the sheet-shaped graphenes and the line-shaped CNTs, and a highly reliable multilayer wiring structure is realized.

Second Embodiment

FIG. 10A to FIG. 11C are schematic cross-sectional views illustrating a method of manufacturing a semiconductor device according to a second embodiment in order of processes. In this embodiment, a method like dual damascene is employed for forming wiring structures which become carbon conductive structures. Note that the same consistent members and so on as those of the first embodiment will be denoted by the same reference signs and a detailed description thereof will be omitted.

First, a MOS transistor 1 is formed on a semiconductor substrate 11, as in FIG. 1A of the first embodiment.

Figure 10A:
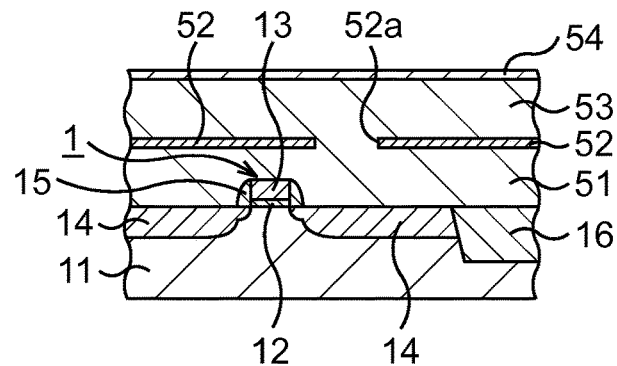
FIG. 10A to FIG. 10C are schematic cross-sectional views illustrating a method of manufacturing a semiconductor device according to a second embodiment in order of processes.

Subsequently, as illustrated in FIG. 10A, a catalytic metal film 51, an etching stopper film 52, a catalytic metal film 53, and an inactivation film 54 are formed. Note that, in FIG. 10A to FIG. 11C, the illustration of part of the MOS transistor 1 is omitted.

In more detail, first, a gate insulating film 12, a gate electrode 13, and sidewalls 15 are covered by a protective film of, for example, SiN or the like.

Next, Co, Ni, Fe, Pt, or the like being metal which serves as a catalyst in graphene formation, for example, Co is deposited to a thickness of, for example, about 300 nm on the semiconductor substrate 11 by a sputtering method or the like. Consequently, the catalytic metal film 51 is formed on the semiconductor substrate 11.

Next, for example, silicon carbide is deposited to a thickness of, for example, about 30 nm on the catalytic metal film 51. Consequently, the etching stopper film 52 is formed on the catalytic metal film 51.

Next, an opening is formed in the etching stopper film 52 by lithography and dry etching. Consequently, an opening 52a for forming a connection hole in the catalytic metal film 51 is formed in the etching stopper film 52.

Next, Co, Ni, Pt, or the like being metal which serves as a catalyst in the graphene formation, for example, Co is deposited to a thickness of, for example, about 300 nm on the etching stopper film 52 by a sputtering method or the like. Consequently, the catalytic metal film 53 is formed on the etching stopper film 52.

Next, Ti, TiN, $SiO_2$, or the like being a material which obstructs the graphene formation, here, $SiO_2$ is deposited to a thickness of, for example, about 30 nm on the catalytic metal film 53 by a sputtering method or the like. Consequently, the inactivation film 54 is formed on the catalytic metal film 53.

Figure 10B:
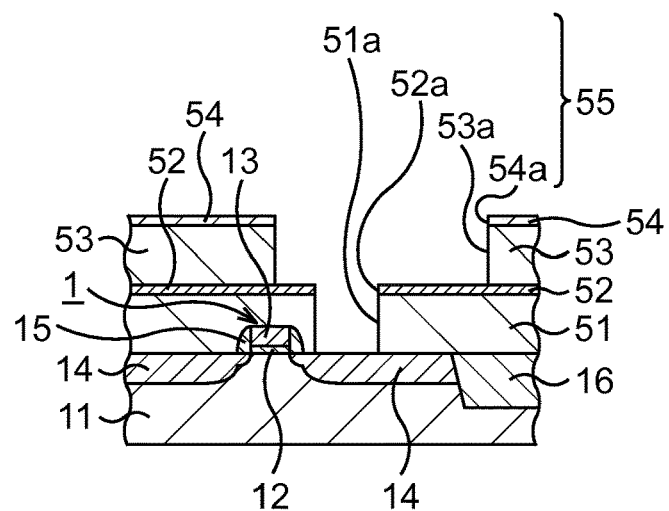

Subsequently, as illustrated in FIG. 10B, a wiring structure trench 55 is formed in the catalytic metal film 51, the etching stopper film 52, the catalytic metal film 53, and the inactivation film 54.

In more detail, a resist mask having an opening in a wiring line shape is formed on the inactivation film 54. By using this resist mask, the inactivation film 54 and the catalytic metal films 51, 53 are dry-etched. At this time, first, wiring trenches 53a, 54a are formed in the catalytic metal film 53 and the inactivation film 54. When the dry etching is subsequently performed, the etching stopper film 52 functions as a hard mask and a connection hole 51a in the shape of the opening 52a of the etching stopper film 52 is formed in the catalytic metal film 51. The resist mask is removed by ashing or the like. Consequently, the wiring structure trench 55 in which the connection hole 51a, the opening 52a, and the wiring trenches 53a, 54a are integrated is formed in the catalytic metal film 51, the etching stopper film 52, the catalytic metal film 53, and the inactivation film 54.

Here, when the wiring structure trench 55 is formed so that its horizontal sectional shape becomes, for example, a rectangular shape, it is desirable that the wiring structure trench 55 exposes the catalytic metal films 51, 53 from its pair of sidewalls appearing in FIG. 10B, and on its other pair of sidewalls, the inactivation film is formed.

Figure 10C:
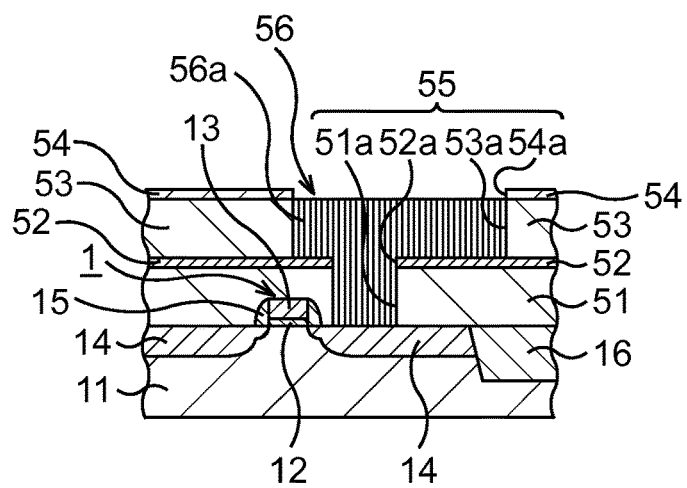

Subsequently, as illustrated in FIG. 10C, a multilayer graphene 56 is formed.

In more detail, carbon is deposited in the wiring structure trench 55 by a CVD method. As a CVD condition, diluent gas such as methane or acetylene is used, and a processing temperature is set to about 600° C. to about 1200° C., here about 600° C. At this time, the carbon is not deposited on a surface of the catalytic metal film 53 because the inactivation film 54 is formed thereon, and is deposited only on the pair of side surfaces in the wiring structure trench 55 where the inactivation film 54 does not exist. In this case, sheet-shaped graphenes 56a are stacked in a plurality of layers along (in parallel to) the pair of side surfaces, so that the multilayer graphene 56 filling the inside of the wiring structure trench 55 is formed. That is, the multilayer graphene 56 is formed in a state where the graphenes 56a grow in a vertical direction along contact surfaces of the catalytic metal films 51, 53 (the pair of side surfaces), and the plural layers of graphenes 56a are stacked to fill the inside of the wiring structure trench 55.

Figure 11A:
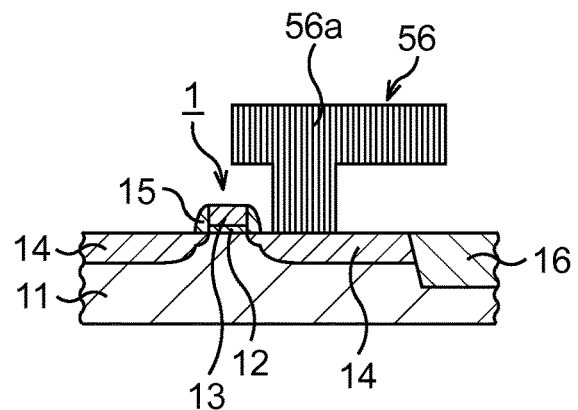
FIG. 11A to FIG. 11C, continuing from FIG. 10C, are schematic cross-sectional views illustrating the method of manufacturing the semiconductor device according to the second embodiment in order of processes.

Subsequently, as illustrated in FIG. 11A, the catalytic metal film 51, the etching stopper film 52, the catalytic metal film 53, and the inactivation film 54 are removed.

In more detail, the catalytic metal film 51, the etching stopper film 52, the catalytic metal film 53, and the inactivation film 54 are subjected to acid treatment by using, for example, a $FeCl_3$ aqueous solution, a HCl dilute aqueous solution, or the like. Alternatively, they are subjected to dry etching treatment by using RIE or the like. These treatments may be combined. Consequently, the etching stopper film 52, the catalytic metal film 53, and the inactivation film 54 are removed.

Figure 11B:
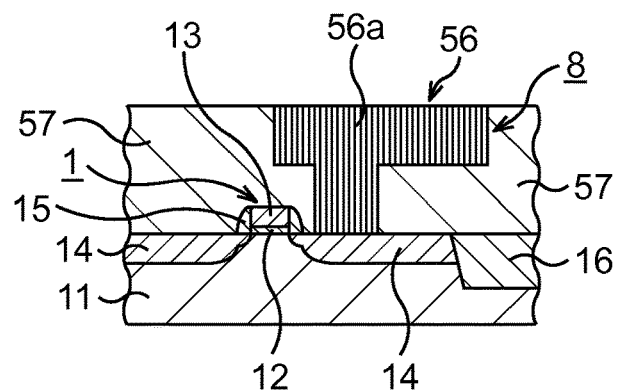

Subsequently, as illustrated in FIG. 11B, an interlayer insulating film 57 covering side surfaces of the multilayer graphene 56 is formed.

In more detail, first, an insulating material, for example, a silicon oxide is deposited on the semiconductor substrate 11 by a CVD method, a SOG method, or the like so as to cover the multilayer graphene 56.

Next, the silicon oxide is polished by, for example, CMP by using an upper surface of the multilayer graphene 56 as a polishing stopper, whereby the silicon oxide is planarized. By this planarization, the interlayer insulating film 57 covering the side surfaces of the multilayer graphene 56 is formed. The multilayer graphene 56 becomes a wiring structure 8 buried in the interlayer insulating film 57. The wiring structure 8 is formed so that main surfaces of the graphenes 56a stacked along the vertical direction and a main surface (front surface) of the interlayer insulating film 57 intersect with each other, in this embodiment, are substantially perpendicular to each other.

In the state in FIG. 11B, molecules of a different kind may be intercalated in the wiring structure 8. The intercalated molecules of the different kind are not particularly limited, but at least one kind selected from $FeCl_3$, K, Rb, Cs, Li, $HNO_3$, $SbCl_5$, $SbF_5$, $Br_2$, $AlCl_3$, $NiCl_2$, $AsF_5$, and $AuCl_3$ is desirably used. Here, $FeCl_3$ is used, for instance. This intercalation makes it possible to greatly lower electric resistance and thermal resistance of the wiring structure 8.

Adhesiveness of the wiring structure 8 is kept in the interlayer insulating film 57. Therefore, the wiring structure 8 is formed in the interlayer insulating film 57 without barrier metal or the like being interposed therebetween. By adopting this structure, the wiring structure 8 is formed only of the multilayer graphene 56 (and the intercalant) without having the other structure (barrier metal or the like) which causes an increase of the electric resistance and the thermal resistance, enabling further reduction of the electric resistance and further reduction of the thermal resistance of the wiring structure 8.

Figure 11C:
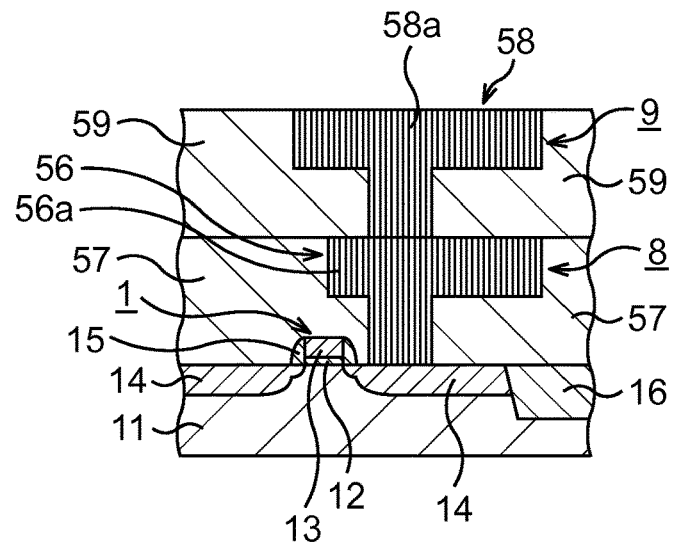

Subsequently, as illustrated in FIG. 11C, on the wiring structure 8, a wiring structure 9 connected thereto is formed.

The wiring structure 9 is formed in substantially the same manner as the wiring structure 8.

Specifically, on the interlayer insulating film 57, a multilayer graphene 58 in which a plurality of layers of sheet-shaped graphenes 58a are stacked along the vertical direction is formed, and an interlayer insulating film 59 covering side surfaces of the multilayer graphene 58 is formed. Consequently, the wiring structure 9 in which the multilayer graphene 58 is buried in the interlayer insulating film 59 is formed. Molecules of a different kind may be intercalated in the wiring structure 9.

The wiring structure 8 and the wiring structure 9 are electrically connected by the multilayer graphenes 56, 58 being bonded. In this case, edge portions of the graphenes 56a of the multilayer graphene 56 and edge portions of the graphenes 58a of the multilayer graphene 58 are in contact with each other to be electrically connected. Thus bonding the graphenes 56a and the graphenes 58a at their edge portions suppresses an increase of the electric resistance and the thermal resistance of the wiring structures 8, 9 ascribable to this bonding as much as possible.

Thereafter, similarly to the wiring structure 9, the necessary number of wiring structures connected to the wiring structure 9 are formed sequentially on the wiring structure 9, whereby a multilayer wiring structure is formed. Consequently, the semiconductor device is formed.

Incidentally, in this embodiment, the case where the multilayer wiring structure is formed directly on the MOS transistor is described as an example, but it is also possible to form this multilayer wiring structure in advance and connect it by transfer or the like to a substrate on which the MOS transistor is formed.

As described hitherto, according to this embodiment, it is possible to easily and surely obtain simple wiring capable of sufficiently exhibiting excellent low electric resistance and low thermal resistance of the sheet-shaped graphenes, and a highly reliable multilayer wiring structure is realized.

Incidentally, in the above manufacturing method, the case where the multilayer graphenes are formed by the CVD method is described as an example, but this embodiment is not limited to this. For example, the multilayer graphenes may be formed by a sputtering method or a vapor deposition method instead of the CVD method. Hereinafter, a case where the sputtering method is used will be described.

FIG. 12A to FIG. 12D are schematic cross-sectional views illustrating a case where the multilayer graphene of the wiring structure 8 is formed by the sputtering method in the first embodiment.

Figure 12A:
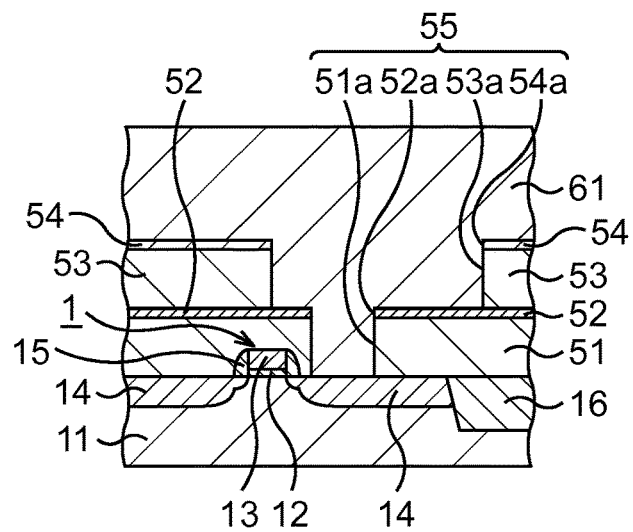
FIG. 12A to FIG. 12D are schematic cross-sectional views illustrating a case where a multilayer graphene of a graphene plug is formed by a sputtering method in the second embodiment.

In this case, after the various processes in FIG. 10A to FIG. 11B, carbon 61 is deposited as illustrated in FIG. 12A.

In more detail, the carbon 61 is deposited to a thickness of, for example, about 600 nm on the whole surface including the inside of the wiring structure trench 55, by a directive sputtering method or the like. Incidentally, the vapor deposition method may be used instead of the sputtering method.

Figure 12B:
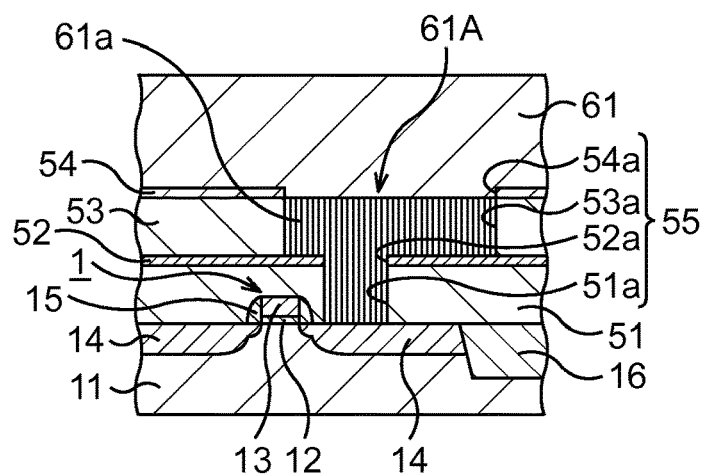

Subsequently, as illustrated in FIG. 12B, a multilayer graphene 61A is formed.

In more detail, a processing temperature is set to 600° C. or higher, here, about 1200° C., and the carbon 61 is heat-treated, with the processing time being set to about one second to about one hour depending on the processing temperature, here, about twenty seconds. Consequently, portions, of the carbon 61, that are in contact with the pair of side surfaces in the wiring structure trench 55 where the inactivation film does not exist turn into a stacked structure of sheet-shaped graphenes 61a, and the multilayer graphene 61A filling the inside of the wiring structure trench 55 is formed. That is, the multilayer graphene 61A is formed in a state where the graphenes 61a grow in the vertical direction along contact surfaces (pair of side surfaces) of the catalytic metal films 51, 53 and the plural layers of graphenes 61a fill the wiring structure trench 55.

Figure 12C:
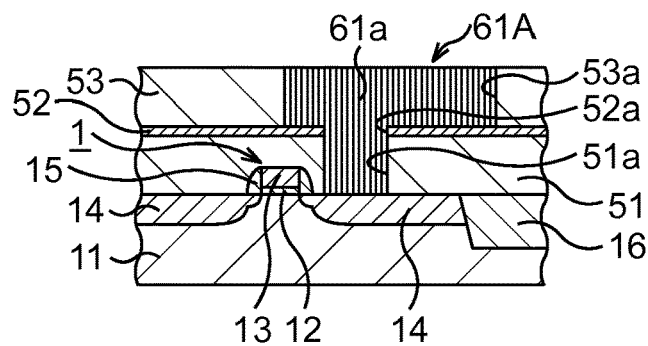

Subsequently, as illustrated in FIG. 12C, the carbon 61 and the inactivation film 54 are removed.

In more detail, the carbon 61 not having undergone a reaction on the multilayer graphene 61A and the inactivation film 54 are polished by, for example, CMP, with the surface of the catalytic metal film 53 used as a polishing stopper. As a result of this polishing, the multilayer graphene 61A remains in the wiring structure trench 55.

Figure 12D:
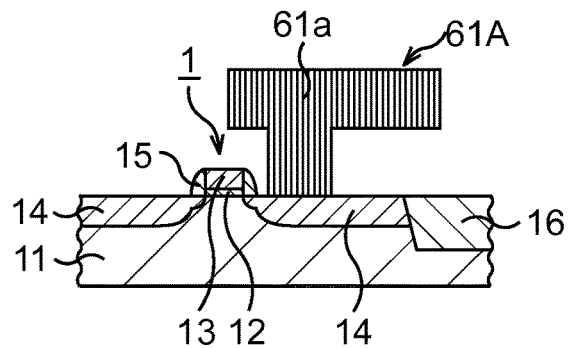

Subsequently, as illustrated in FIG. 12D, the catalytic metal film 51, the etching stopper film 52, and the catalytic metal film 53 are removed.

In more detail, the catalytic metal film 51, the etching stopper film 52, and the catalytic metal film 53 are subjected to acid treatment by using, for example, a $FeCl_3$ aqueous solution, a HCl dilute aqueous solution, or the like. Alternatively, they are subjected to dry etching treatment by using RIE or the like. These treatments may be combined. Consequently, the catalytic metal film 51, the etching stopper film 52, and the catalytic metal film 53 are removed. Thereafter, the various processes from FIG. 11B on are performed.

Incidentally, the multilayer graphenes of the wiring structure 9 and the wiring structures thereon may also be formed by the sputtering method or the vapor deposition method similarly to the above.

Third Embodiment

FIG. 13A to FIG. 14C are schematic cross-sectional views illustrating a method of manufacturing a semiconductor device according to a third embodiment in order of processes. In this embodiment, a multilayer graphene of each wiring structure which becomes a carbon conductive structure is formed by an integrated structure of vertical and lateral graphenes. Note that the same consistent members and so on as those of the first embodiment will be denoted by the same reference signs and a detailed description thereof will be omitted.

First, a MOS transistor 1 is formed on a semiconductor substrate 11, as in FIG. 1A of the first embodiment.

Figure 13A:
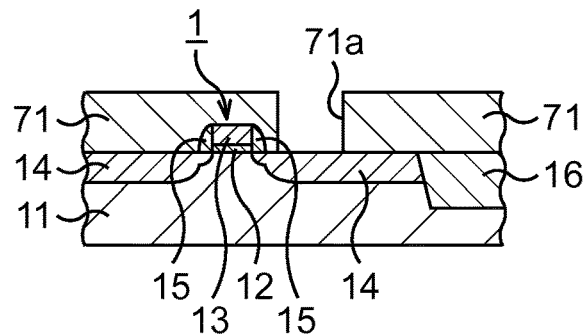
FIG. 13A to FIG. 13C are schematic cross-sectional views illustrating a method of manufacturing a semiconductor device according to a third embodiment in order of processes.

Subsequently, as illustrated in FIG. 13A, a catalytic metal film 71 having an opening 71a at a connection position with the MOS transistor 1 is formed. Note that, in FIG. 13A to FIG. 14C, the illustration of part of the MOS transistor 1 is omitted.

In more detail, first, a gate insulating film 12, a gate electrode 13, and sidewalls 15 are covered by a protective film of, for example, SiN or the like.

Next, Co, Ni, Fe, Pt, or the like being metal which serves as a catalyst in graphene formation, for example, Co is deposited to a thickness of, for example, about 300 nm on the semiconductor substrate 11 by a sputtering method or the like. Consequently, the catalytic metal film 71 is formed on the semiconductor substrate 11.

Next, by lithography and dry etching, a plug formation position of the catalytic metal film 71 is opened. Consequently, an opening 71a is formed in the catalytic metal film 71.

Here, when the opening 71a is formed so that its horizontal sectional shape becomes, for example, a rectangular shape, it is desirable that the opening 71a exposes the catalytic metal film 71 from its pair of sidewalls appearing in FIG. 13A, and on its other pair of sidewalls, the inactivation film which obstructs graphene formation is formed.

Figure 13B:
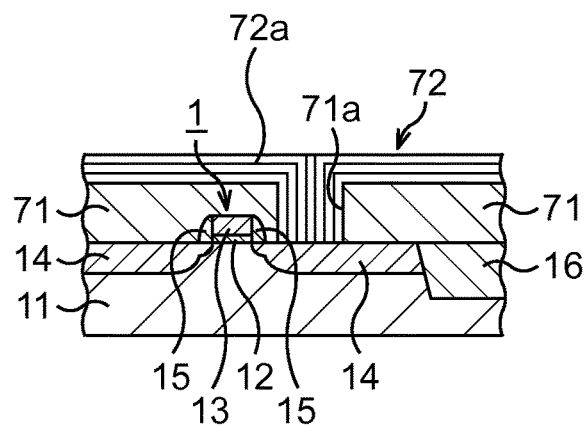

Subsequently, as illustrated in FIG. 13B, a multilayer graphene 72 is formed.

In more detail, carbon is deposited on the whole surface including the inside of the opening 71a by a CVD method. As a CVD condition, diluent gas such as methane or acetylene is used, and a processing temperature is set to about 600° C. to about 1200° C., here about 600° C. At this time, the carbon is deposited on exposed surfaces of the catalytic metal film 71, that is, from the pair of side surfaces of the opening 71a up to an upper surface of the catalytic metal film 71. In this case, in the opening 71a, sheet-shaped graphenes 72a are stacked in a plurality of layers along (in parallel to) the pair of side surfaces to fill the inside of the opening 71a, and on the upper surface of the catalytic metal film 71, the sheet-shaped graphenes 72a are stacked in a plurality of layers along (in parallel to) this upper surface, so that the multilayer graphene 72 is formed. That is, the multilayer graphene 72 is formed in a state where the graphenes 72a grow along contact surfaces of the catalytic metal film 71 (the pair of side surfaces of the opening 71a and the upper surface of the catalytic metal film 71), that is, in the opening 71a, they grow in the vertical direction, and on the upper surface of the catalytic metal film 71, they grow in the lateral direction, and the both are integrally formed, so that the graphenes 72a are stacked in the plural layers from the inside of the opening 71a up to the upper surface of the catalytic metal film 71.

Figure 13C:
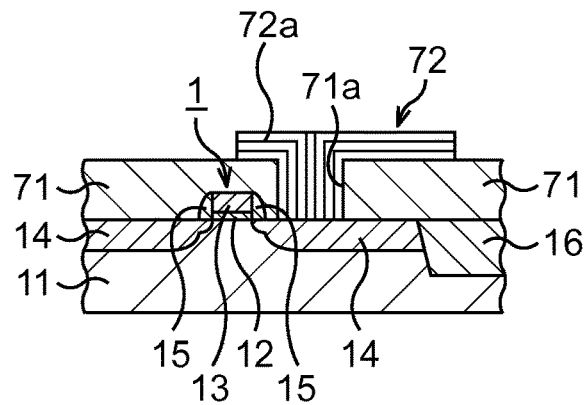

Subsequently, as illustrated in FIG. 13C, the multilayer graphene 72 is appropriately processed.

In more detail, a predetermined portion, of the multilayer graphene 72, which is on the upper surface of the catalytic metal film 71 is removed by lithography and dry etching, whereby the multilayer graphene 72 is processed into a desired wiring state.

Figure 14A:
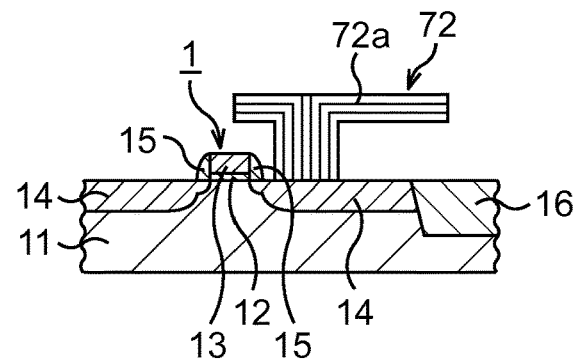
FIG. 14A to FIG. 14C, continuing from FIG. 13C, are schematic cross-sectional views illustrating the method of manufacturing the semiconductor device according to the third embodiment in order of processes.

Subsequently, as illustrated in FIG. 14A, the catalytic metal film 71 is removed.

In more detail, the catalytic metal film 71 is subjected to acid treatment by using, for example, a $FeCl_3$ aqueous solution, a HCl dilute aqueous solution, or the like. Consequently, the catalytic metal film 71 is removed.

Figure 14B:
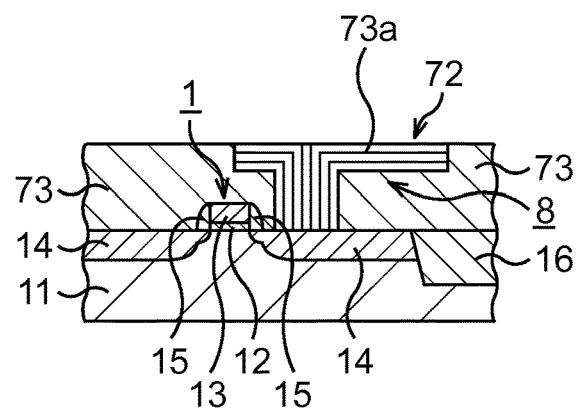

Subsequently, as illustrated in FIG. 14B, an interlayer insulating film 73 covering side surfaces of the multilayer graphene 72 is formed.

In more detail, first, an insulating material, for example, a silicon oxide is deposited on the semiconductor substrate 11 by a CVD method, a SOG method, or the like so as to cover the multilayer graphene 72.

Next, the silicon oxide is polished by, for example, CMP by using an upper surface of the multilayer graphene 72 as a polishing stopper, whereby the silicon oxide is planarized. By this planarization, the interlayer insulating film 73 covering the side surfaces of the multilayer graphene 72 is formed. The multilayer graphene 72 becomes a wiring structure 81 buried in the interlayer insulating film 73. The wiring structure 81 is formed of the stacked graphenes 72a which grow integrally in the vertical direction in the opening 71a and in the lateral direction on the upper surface of the catalytic metal film 71.

In the state in FIG. 14B, molecules of a different kind may be intercalated in the wiring structure 81. The intercalated molecules of the different kind are not particularly limited, but at least one kind selected from $FeCl_3$, K, Rb, Cs, Li, $HNO_3$, $SbCl_5$, $SbF_5$, $Br_2$, $AlCl_3$, $NiCl_2$, $AsF_5$, and $AuCl_3$ is desirably used. Here, $FeCl_3$ is used, for instance. This intercalation makes it possible to greatly lower electric resistance and thermal resistance of the wiring structure 81.

Adhesiveness of the wiring structure 81 is kept in the interlayer insulating film 73. Therefore, the wiring structure 81 is formed in the interlayer insulating film 73 without barrier metal or the like being interposed therebetween. By adopting this structure, the wiring structure 81 is formed only of the multilayer graphene 72 (and the intercalant) without having the other structure (barrier metal or the like) which causes an increase of the electric resistance and the thermal resistance, enabling further reduction of the electric resistance and further reduction of the thermal resistance of the wiring structure 81.

Figure 14C:
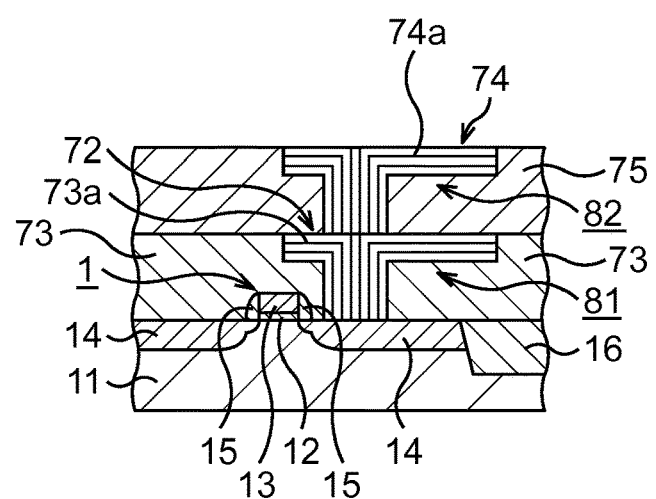

Subsequently, as illustrated in FIG. 14C, a wiring structure 82 connected to the wiring structure 81 is formed on the wiring structure 81.

The wiring structure 82 is formed in substantially the same manner as the wiring structure 81.

Specifically, on the interlayer insulating film 73, a multilayer graphene 74 is formed in which a plurality of layers of sheet-shaped graphenes 74a are stacked, the graphenes 74 being an integration of those growing in the vertical direction in a plug portion and those growing in the lateral direction in a wiring portion. Then, an interlayer insulating film 75 covering side surfaces of the multilayer graphene 74 is formed. Consequently, the wiring structure 82 formed of the multilayer graphene 74 buried in the interlayer insulating film 75 is formed. Molecules of a different kind may be intercalated in the wiring structure 82.

The wiring structure 81 and the wiring structure 82 are electrically connected by the multilayer graphenes 72, 74 being bonded.

Thereafter, similarly to the wiring structure 82, the necessary number of wiring structures connected to the wiring structure 82 are formed sequentially on the wiring structure 82, whereby a multilayer wiring structure is formed. Consequently, the semiconductor device is formed.

Incidentally, in this embodiment, the case where the multilayer wiring structure is formed directly on the MOS transistor is described as an example, but it is also possible to form this multilayer wiring structure in advance and connect it by transfer or the like to a substrate on which the MOS transistor is formed.

As described hitherto, according to this embodiment, it is possible to easily and surely obtain simple wiring capable of sufficiently exhibiting excellent low electric resistance and low thermal resistance of the sheet-shaped graphenes, and a highly reliable multilayer wiring structure is realized.

Incidentally, in the above manufacturing method, the case where the multilayer graphenes are formed by the CVD method is described as an example, but this embodiment is not limited to this. For example, the multilayer graphenes may be formed by a sputtering method or a vapor deposition method instead of the CVD method. Hereinafter, the case where the sputtering method is used will be described.

Figure 15A:
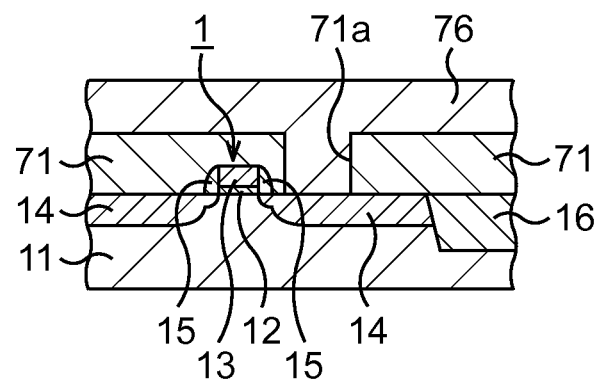
FIG. 15A and FIG. 15B are schematic cross-sectional views illustrating a case where a multilayer graphene of a graphene plug is formed by a sputtering method in the third embodiment.
Figure 15B:
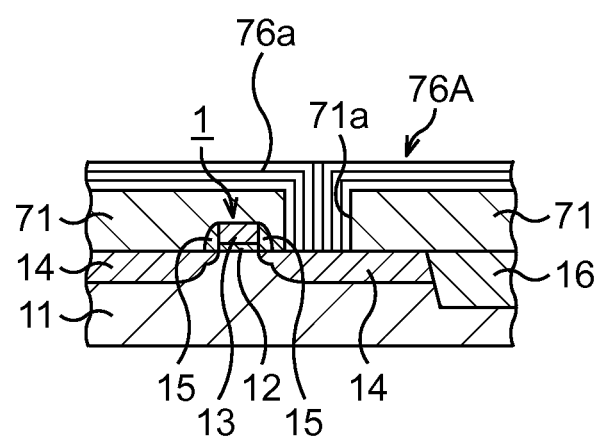

FIG. 15A and FIG. 15B are schematic cross-sectional views illustrating a case where the multilayer graphene of the wiring structure 81 is formed by the sputtering method in the third embodiment.

In this case, after the various processes in FIG. 13A, carbon 76 is deposited as illustrated in FIG. 15A.

In more detail, the carbon 76 is deposited to a thickness of, for example, about 300 nm on the whole surface including the inside of the opening 71a, by a directive sputtering method or the like. Incidentally, the vapor deposition method may be used instead of the sputtering method.

Subsequently, as illustrated in FIG. 15B, a multilayer graphene 76A is formed.

In more detail, a processing temperature is set to 600° C. or higher, here, about 1200° C., and the carbon 76 is heat-treated, with the processing time being set to about one second to about one hour depending on the processing temperature, here, about ten seconds. Consequently, the carbon 76 grows along the contact surfaces of the catalytic metal film 71 (the pair of side surfaces of the opening 71a and the upper surface of the catalytic metal film 71), that is, in the opening 71a, it grows in the vertical direction, and on the upper surface of the catalytic metal film 71, it grows in the lateral direction, so that graphenes 76a are integrally formed, and the plural layers of the graphenes 76a are formed in a state of being stacked from the inside of the opening 71a up to the upper surface of the catalytic metal film 71.

Thereafter, the various processes from FIG. 13C on are performed.

Incidentally, the multilayer graphenes of the wiring structure 82 and the wiring structures thereon may also be formed by the sputtering method or the vapor deposition method similarly to the above.

According to the present invention, it is possible to easily and surely obtain simple wiring capable of sufficiently exhibiting excellent low electric resistance and low thermal resistance of sheet-shaped graphenes and line-shaped carbon nano materials, and a highly reliable carbon conductive structure is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a carbon conductive structure, comprising:
    forming, over a substrate, a plurality of layers of first graphenes formed of graphenes having first surfaces perpendicular to a surface of the substrate;
    forming a first interlayer insulating film to cover side surfaces of the first graphenes so that top portion of the first graphenes which is the gathering of edges of the plurality of layers of the first graphenes are exposed from the first interlayer insulating film;
    after forming the first interlayer insulating film, intercalating, by a first molecule, the top portion of the first graphenes that are exposed from the first interlayer insulating film;
    after intercalating of the top portion of the first graphenes by the first molecule, forming a plurality of layers of second graphenes formed of graphenes having second surfaces perpendicular to the surface of the substrate; and
    forming a second interlayer insulating film to cover side surfaces of the second graphenes, wherein
    the top portion of the first graphenes and a bottom portion of the second graphenes are directly connected to each other,
    the side portions of the first graphenes and the first interlayer insulating film are directly connected to each other, and
    the side portions of the second graphenes and the second interlayer insulating film are directly connected to each other,
    the first surfaces of the first graphenes and the second surfaces of the second graphenes are intersect to each other.

* * * * *